United States Patent
Yamakura

[19]

[11] Patent Number: 6,167,548
[45] Date of Patent: Dec. 26, 2000

[54] DATA ERROR CORRECTING METHOD AND APPARATUS

[75] Inventor: Kenichi Yamakura, Kasugai, Japan

[73] Assignee: Fujitsu Limited, Kawasaki, Japan

[21] Appl. No.: 09/040,999

[22] Filed: Mar. 19, 1998

[30] Foreign Application Priority Data

Sep. 30, 1997 [JP] Japan .................................. 9-266582

[51] Int. Cl.[7] .................................................. G11C 29/00
[52] U.S. Cl. .......................................................... 714/763
[58] Field of Search .................................. 714/752, 755, 714/763, 764, 765

[56] References Cited

U.S. PATENT DOCUMENTS

| | | | |
|---|---|---|---|
| 4,785,451 | 11/1988 | Sako et al. ............................... | 714/756 |
| 5,068,855 | 11/1991 | Kashida et al. ......................... | 714/755 |
| 5,371,751 | 12/1994 | Moriyama ............................... | 714/758 |
| 5,392,299 | 2/1995 | Rhines et al. ........................... | 714/756 |
| 5,684,810 | 11/1997 | Nakamura et al. ..................... | 714/755 |
| 5,729,647 | 3/1998 | Kim ......................................... | 386/109 |
| 5,745,506 | 4/1998 | Yamashita et al. ..................... | 714/760 |

*Primary Examiner*—Albert De Cady
*Assistant Examiner*—Shelly A Chase
*Attorney, Agent, or Firm*—Staas & Halsey, LLP

[57] ABSTRACT

A data error correcting method and apparatus reads two dimensional block data having row data and row error correcting codes and column data and column error correcting codes. In the block data, one column error correcting code is assigned to one column data group, and individual column data groups and individual column error correcting codes are alternately arranged. A control unit corrects errors in the block data on a row by row basis using the row error correcting codes and the row data. The control unit also corrects errors on a column by column basis, in parallel with the row errors, using the column error correcting codes and the column data. The control unit includes a compensation input data generator having a data adjustor and a Galois multiplier. The data adjustor computes a Compensation Galois constant for compensating the input order of the data.

16 Claims, 11 Drawing Sheets

Fig.13

| Data input order (PI interleave No.) | Original position | Multiplication of ai at time of syndrome computation | | Compensation times |
|---|---|---|---|---|
| | | Necessary operation number | Actual operation number | |
| 0~ 11 | 0~ 11 | 207~196 | 207~196 | 0 |
| (P00) 12 | 192 | 15 | 195 | -180 |
| 13~ 24 | 12~ 23 | 195~184 | 194~183 | 1 |
| (P01) 25 | 193 | 14 | 182 | -168 |
| 26~ 37 | 24~ 35 | 183~172 | 181~170 | 2 |
| (P02) 38 | 194 | 13 | 169 | -156 |
| 39~ 50 | 36~ 47 | 171~160 | 168~157 | 3 |
| (P03) 51 | 195 | 12 | 156 | -144 |
| 52~ 63 | 48~ 59 | 159~148 | 155~144 | 4 |
| (P04) 64 | 196 | 11 | 143 | -132 |
| 65~ 76 | 60~ 71 | 147~136 | 142~131 | 5 |
| (P05) 77 | 197 | 10 | 130 | -120 |
| 78~ 89 | 72~ 83 | 135~124 | 129~118 | 6 |
| (P06) 90 | 198 | 9 | 117 | -108 |
| 91~102 | 84~ 95 | 123~112 | 116~105 | 7 |
| (P07) 103 | 199 | 8 | 104 | -96 |
| 104~115 | 96~107 | 111~100 | 103~ 92 | 8 |
| (P08) 116 | 200 | 7 | 91 | -84 |
| 117~128 | 108~119 | 99~ 88 | 90~ 79 | 9 |
| (P09) 129 | 201 | 6 | 78 | -72 |
| 130~141 | 120~131 | 87~ 76 | 77~ 66 | 10 |
| (P010) 142 | 202 | 5 | 65 | -60 |
| 143~154 | 132~143 | 75~ 64 | 64~ 51 | 11 |
| (P011) 155 | 203 | 4 | 52 | -48 |
| 156~167 | 144~155 | 63~ 52 | 51~ 40 | 12 |
| (P012) 168 | 204 | 3 | 39 | -36 |
| 169~180 | 156~167 | 51~ 40 | 38~ 27 | 13 |
| (P013) 181 | 205 | 2 | 26 | -24 |
| 182~192 | 168~179 | 39~ 28 | 25~ 14 | 14 |
| (P014) 194 | 206 | 1 | 13 | -12 |
| 195~206 | 180~191 | 27~ 16 | 12~ 1 | 15 |
| (P015) 207 | 207 | 0 | 0 | 0 |

Fig.14

| Data input order (PI interleave No.) | Order i | | | | | | | | | | | | | | | |
|---|---|---|---|---|---|---|---|---|---|---|---|---|---|---|---|---|
| | 15 | 14 | 13 | 12 | 11 | 10 | 9 | 8 | 7 | 6 | 5 | 4 | 3 | 2 | 1 | 0 |
| 0~ 11 | 1 | 1 | 1 | 1 | 1 | 1 | 1 | 1 | 1 | 1 | 1 | 1 | 1 | 1 | 1 | 1 |
| (P00) 12 | 1A | 60 | 59 | A9 | B9 | 2C | 91 | DF | 26 | 64 | 3B | C1 | 24 | 55 | 0F | 1 |
| 13~ 24 | 26 | 13 | 87 | CD | E8 | 74 | 3A | 1D | 80 | 40 | 20 | 10 | 8 | 4 | 2 | 1 |
| (P01) 25 | 60 | 7 | CE | 8F | 82 | 1A | 2D | 6E | 86 | CD | 96 | B6 | 40 | F1 | 7F | 1 |
| 26~ 37 | 60 | 18 | 6 | 8F | EA | B4 | 2D | 4C | 13 | CD | 74 | 1D | 40 | 10 | 4 | 1 |
| (P02) 38 | 59 | CE | CD | FC | 2F | 24 | 66 | 0C | C4 | 6B | 2C | 15 | B5 | 7 | 86 | 1 |
| 39~ 50 | C1 | B5 | 35 | 25 | 27 | 60 | 0C | 8F | 75 | 2D | 26 | CD | 3A | 40 | 8 | 1 |
| (P03) 51 | A9 | 8F | FC | BA | 38 | DF | FB | C5 | CD | E4 | C1 | 57 | 78 | 8A | CE | 1 |
| 52~ 63 | B9 | 5D | 14 | 46 | EE | 6A | 25 | 9D | 18 | 8F | B4 | 4C | CD | 1D | 10 | 1 |
| (P04) 64 | B9 | 82 | 2F | 38 | 78 | 59 | 7F | 56 | D9 | 3D | 1A | 8B | 3E | CF | C5 | 1 |
| 65~ 76 | 0F | 5E | BE | B9 | A0 | 5 | C1 | 6A | 9C | 60 | 3 | B4 | 26 | 74 | 20 | 1 |
| (P05) 77 | 2C | 1A | 24 | DF | 59 | 0F | 64 | B9 | 96 | C1 | 91 | 60 | 55 | 26 | A9 | 1 |
| 78~ 89 | DF | 6B | 78 | 65 | 61 | B9 | 50 | 46 | B5 | 25 | 60 | 8F | 2D | CD | 40 | 1 |
| (P06) 90 | 91 | 2D | 66 | FB | 7F | 64 | 46 | E4 | 3A | ED | 24 | 78 | 6E | 35 | 29 | 1 |
| 91~102 | 1A | 43 | A3 | 6B | 3C | 5E | A1 | 5D | 8C | B5 | 9C | 18 | 75 | 13 | 80 | 1 |
| (P07) 103 | DF | 6E | 0C | C5 | 56 | B9 | E4 | AD | B6 | 57 | 60 | 66 | 8A | A1 | 73 | 1 |
| 104~115 | 3B | 81 | 0D | D9 | FE | FD | 65 | 5F | 5D | 46 | 6A | 9D | 8F | 4C | 1D | 1 |
| (P08) 116 | 26 | 86 | C4 | CD | D9 | 96 | 3A | B6 | DB | 40 | DF | F1 | 8 | 7F | B3 | 1 |
| 117~128 | A9 | 66 | ED | D0 | 86 | DF | E7 | 65 | A1 | 50 | C1 | 25 | 0C | 2D | 3A | 1 |
| (P09) 129 | 64 | CD | 6B | E4 | 3D | C1 | ED | 57 | 40 | 78 | 55 | 8A | 35 | CE | C4 | 1 |
| 130~141 | 55 | 84 | 2E | 3B | 67 | 11 | DF | FD | 5E | B9 | 5 | 6A | 60 | B4 | 74 | 1 |
| (P010) 142 | 3B | 96 | 2C | C1 | 1A | 91 | 24 | 60 | DF | 55 | 59 | 26 | 0F | A9 | 64 | 1 |
| 143~154 | 91 | 39 | 54 | B8 | 76 | 67 | 86 | FE | 3C | 61 | A0 | EE | 27 | EA | E8 | 1 |
| (P011) 155 | C1 | B6 | 15 | 57 | 8B | 60 | 78 | 66 | F1 | 8A | 26 | A1 | CE | 73 | A6 | 1 |
| 156~167 | 96 | FC | E4 | A8 | B8 | 3B | D0 | D9 | 6B | 65 | B9 | 46 | 25 | 8F | CD | 1 |
| (P012) 168 | 24 | 40 | B5 | 78 | 3E | 55 | 6E | 8A | 8 | 35 | 0F | CE | 29 | C4 | 56 | 1 |
| 169~180 | 64 | 62 | E5 | E4 | 54 | 2E | ED | 0D | A3 | 78 | BE | 14 | 35 | 6 | 87 | 1 |
| (P013) 181 | 55 | F1 | 7 | 8A | CF | 26 | 35 | A1 | 7F | CE | A9 | 73 | C4 | A6 | F5 | 1 |
| 182~192 | 59 | C8 | 62 | FC | 39 | 84 | 66 | 81 | 43 | 6B | 5E | 5D | B5 | 18 | 13 | 1 |
| (P014) 194 | 0F | 7F | 86 | CE | C5 | A9 | 29 | 73 | B3 | C4 | 64 | A6 | 56 | F5 | 7D | 1 |
| 195~206 | 24 | 59 | 64 | 96 | 91 | 55 | A9 | 3B | 1A | DF | 0F | B9 | C1 | 60 | 26 | 1 |
| (P015) 207 | 1 | 1 | 1 | 1 | 1 | 1 | 1 | 1 | 1 | 1 | 1 | 1 | 1 | 1 | 1 | 1 |

DATA ERROR CORRECTING METHOD AND APPARATUS

BACKGROUND OF THE INVENTION

The present invention relates to a data error correcting method and apparatus which correct errors in data read from a recording medium.

As the recording capacity of recording media, such as an optical disk, increases, the time required to read data from such recording media increases. The time necessary for data reading includes the time required for an error correcting operation. In order to decrease data reading time, it is necessary to shorten the time required for error correction.

An ECC (Error Correcting Code) has previously been affixed to data recorded on a recording medium (an audio tape, video tape, CD, DVD or the like) to correct an error which may occur at the time of reading the data. Data to be recorded on a DVD-ROM, for example, is formatted as illustrated in FIG. 1. A sector 1 includes an ID and reserve area of 12 bytes, user data of 2 Kbytes and an EDC (Error Detecting Code) of 4 bytes. Each sector 1 includes twelve rows of data which extend in the PI direction (row direction). The first row of data in each sector 1 consists of 172 bytes. Recorded in the first row are the 12-byte ID and reserve area and 160-byte user data. In the last row are recorded 168-byte user data and 4-byte EDC. Each of the intermediate rows has 172-bytes of user data.

As shown in FIG. 2, a data block 2 includes sixteen sectors 1, a PO-ECC section 3 and a PI-ECC section 4. The PO-ECC section 3 is an error correcting code for data in the PO direction (column direction) which exist over the individual sectors 1, and the PI-ECC section 4 is an error correcting code for data in each sector 1. The PI-ECC section 4 is affixed to generate a syndrome for error correction for each row in the PI direction in the data block 2 or for each PI interleave. The PO-ECC section 3 is affixed to generate a syndrome for error correction for each column in the PO direction in the data block 2 or for each PO interleave.

The data block 2 is stored on the DVD-ROM in the encoding format as shown in FIG. 5. The PO-ECC section 3 is segmented for the individual interleaves, with one interleave inserted between sectors 1. "One interleave" is a row or a column of data which includes user data and an error correcting code. The format can ensure high error detecting and correcting performance in an error correcting operation at the time of data reproduction.

FIG. 7 shows a syndrome operation unit which generates a syndrome in an error correcting operation. An EOR gate 5 receives data, read from a recording medium, byte by byte, and sends an output signal to a latch circuit 6. The latch circuit 6 receives the signal from the EOR gate 5 (Exclusive-OR) and sends a signal to a Galois constant multiplier 7. The Galois constant multiplier 7 performs an arithmetic operation on the signal received from the latch circuit 6. The Galois constant multiplier 7 sends an acquired Galois constant to the EOR gate 5. In the syndrome operation unit, every time data is sequentially input to the EOR gate 5, the latch circuit 6 outputs an error correcting syndrome Sy.

A conventional error correcting operation in a mode of reading data recorded in the above-described format will now be discussed with reference to FIG. 8.

When data in the PI direction from each sector 1 in the data block 2 is sequentially input byte by byte (step 1), PI syndromes are sequentially generated (step 2). At the same time, the input data in the PI direction is sequentially stored in a buffer memory for each interleave as shown in FIG. 3 (step 3).

When an error correcting syndrome Sy for one interleave in the PI direction is generated, the position and correction value for error data are computed interleave by interleave (step 4), and rewriting of the error data is carried out on the buffer memory (step 5). Such an operation is repeated for every PI interleave.

Next, error correction for the individual PO interleaves in the data block 2 is executed. Data read in the PI direction is stored in the buffer memory as a data block 2a as shown in FIG. 5.

When data is read in the PO direction from the data block 2, PO-ECC data is read byte by byte for every 12 bytes as shown in FIG. 6. The PO interleaves which have been read in the order shown in FIG. 6 are sorted in the order shown in FIG. 4 (step 6), and error correcting syndromes for the individual PO interleaves are generated in that situation (step 7).

The reason for rearranging the PO-ECC data in this manner is because the PO-ECC data is generated based on the data in each sector 1 which has continuously been read in the PO direction as shown in FIG. 2. In other words, it is because arithmetic operations of syndromes have weights in the order of data input. Even when data, which has been weighed in the state shown in FIG. 2, is input to the syndrome operation unit in the input order shown in FIG. 6, the operation unit cannot generate accurate syndromes.

When an error correcting syndrome for one interleave in the PO direction is generated, the position and correction value for error data are computed interleave by interleave (step 8), and rewriting of the error data is carried out on the buffer memory (step 9). The operation is repeated for every PO interleave. Through the operation, data read from the data block 2a is subjected to a high-precision error correcting operation both in the PI and PO directions.

A recording medium like the aforementioned DVD-ROM is used as a data storage means which belongs to the peripheral devices of a computer, and an improvement on the operational speeds of computers demands faster error correction of data read from a recording medium. The above-described conventional error correction, however, takes a relatively long time for data reading and writing with respect to a buffer memory and demands that time to be shortened. As the operational speeds of computers increase, the time required for arithmetic operations for error correction is shortened while the time for data reading and writing with respect to a buffer memory is not shortened as much as desired.

Reading and writing data to and from a buffer memory are executed in steps 3, 5 and 6 in the arithmetic operation on syndromes. In step 5, data reading and writing with respect to the buffer memory are carried out for error correction of data, stored in the buffer memory, in the PI direction. In step 6, data reading and writing with respect to the buffer memory are performed for rearranging data in the PO direction. To shorten the time required for rearranging the data in a different order, it is possible to previously store data in the buffer memory in a rearranged form (see FIG. 2). However, even this case requires an operation for reading data from the buffer memory for error correction in the PO direction.

Because data reading and writing with respect to the buffer memory is repeatedly executed, the time for error correction is undesirably long. As the amount of data in a single data block on a DVD-ROM is very large, the access time for the buffer memory is increased, which inevitably increases the time required for error correction.

The reason error correction takes so long is because error correction in the PI direction and error correction in the PO direction are not carried out in parallel. After the error correction in the PI direction is executed, rearranging data in the PO direction is carried out, and then the error correction in the PO direction is performed. Even in the case where data is stored in the buffer memory in the state of the data block 2 shown in FIG. 2 before error correction in the PI direction, it is necessary to perform error correction in the PI direction after which data id read in the PO direction and is then subjected to error correction.

Accordingly, it is an objective of the present invention to provide a data error correcting method and apparatus which can shorten the time required for error correction.

SUMMARY OF THE INVENTION

To achieve the above objective, the present invention provides a method of correcting an error in two-dimensional block data having row error correcting codes for individual rows of data and column error correcting codes for individual column of data, one column error correcting code being assigned to one column data group, individual column data groups and the individual column error correcting codes being alternately arranged, the method comprising the steps of: correcting errors in block data row by row using the row error correcting codes and row data; and correcting errors column by column in parallel to the row error correcting step, by using the column error correcting codes and column data.

The present invention further provides a method of correcting an error in two-dimensional block data having row error correcting codes for individual rows of data and column error correcting codes for individual columns of data, one column error correcting code being assigned to a predetermined number of the column data, the column data and the individual column error correcting codes being alternately arranged, the row data and the column error correcting codes having a first weight according to a first order such that the individual column error correcting codes are arranged after all of the column data groups, the method comprising the steps of: correcting errors column by column using the row data and the row error correcting codes; receiving the column data; compensating the first weight for generating a second weight according to the received column data when the received column data is in a second order different from the first order; and correcting errors row by row based on the generated second weight, using the column data and the column error correcting codes.

The present invention provides an error correcting apparatus for correcting an error in two-dimensional block data having row error correcting codes for individual rows of data and column error correcting codes for individual columns of data, one column error correcting code being assigned to one column data group, individual column data groups and the individual column error correcting codes being alternately arranged, the apparatus comprising: a control unit which corrects errors in block data row by row using the row error correcting codes and row data, and corrects errors column by column in parallel to the row error correcting, using the column error correcting codes and the column data.

The present invention further provides an error correcting apparatus comprising: a control unit for correcting an error in two-dimensional block data having row error correcting codes for individual rows of data and column error correcting codes for individual column of data, one column error correcting code being assigned to one column data group, the column data group and the individual column error correcting codes being alternately arranged, the column data and the column error correcting codes having a first weight according to a first order such that the individual column error correcting codes are arranged after all column data groups; and a compensating device for compensating the first weight for generating a second weight according to the received column data when the received column data is in a second order different from the first order, wherein the control unit corrects errors column by column using the row data and the row error correcting codes, and corrects errors row by row based on the generated second weight using the column data and the column error correcting codes.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

FIG. 13 is a table showing the number of compensation operations with respect to the input order for PO interleaves in accordance with the present invention;

FIG. 14 is a data table showing compensation Galois constants with respect to the input order for PO interleaves in accordance with the present invention;

DETAILED DESCRIPTION OF THE PREFERRED EMBODIMENTS

First Embodiment

A first embodiment of the present invention will now be described referring to the accompanying drawings.

Figure 9:
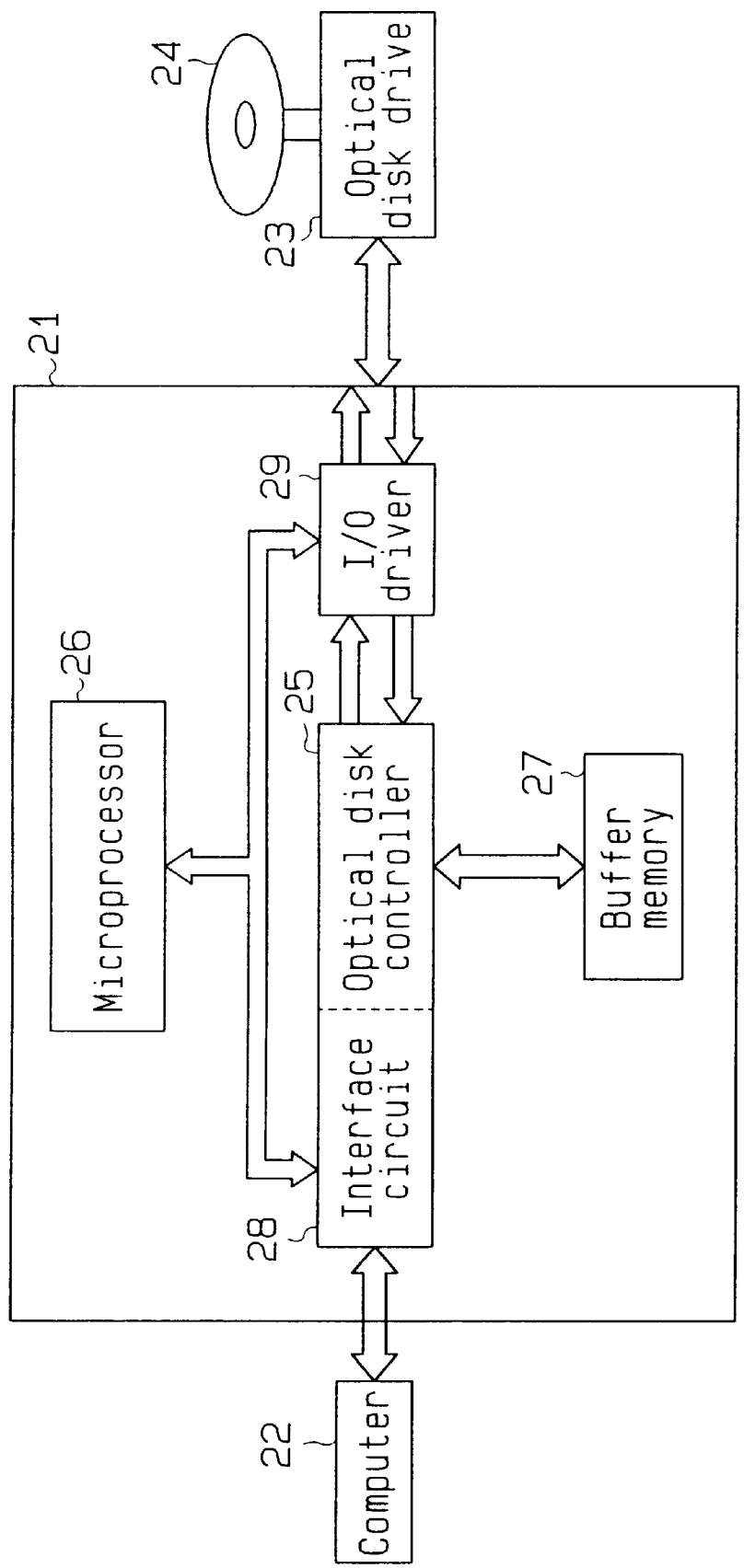
FIG. 9 is a schematic block diagram depicting an optical disk controller in accordance with the present invention.

As shown in FIG. 9, an optical disk controller 21 is connected to a computer 22 via an interface, preferably ATAPI (AT Attachment Packet Interface). The optical disk controller 21 is also connected to an optical disk drive 23 via another interface.

The optical disk drive 23 rotates a recording medium, i.e., a digital video disk (DVD) 24 at a predetermined velocity, and reads data recorded on the DVD 24 by means of an optical pickup (not shown). Then, the optical disk drive 23 sends the read data to the optical disk controller 21.

The optical disk controller 21 comprises an optical disk control unit (hereinafter simply called control unit) 25, a microprocessor 26, a storage device, such as an external buffer memory 27, an interface circuit 28 and an input/output (I/O) driver 29.

The control unit 25 carries out various processes, such as transfer of commands to the optical disk drive 23 and reception of status information therefrom, decoding of the read format from an optical disk and correction of errors in data therefrom, data transfer between the optical disk drive 23 and the buffer memory 27, and data transfer between the interface circuit 28 and the buffer memory 27.

The control unit 25 receives data, read by the optical disk drive 23, via the I/O driver 29. The control unit 25 performs a process like error correction on the input data and stores the processed data in the buffer memory 27. Based on a command from the microprocessor 26, the control unit 25 transfers data, stored in the buffer memory 27, to the computer 22 via the interface circuit 28.

Figure 6:
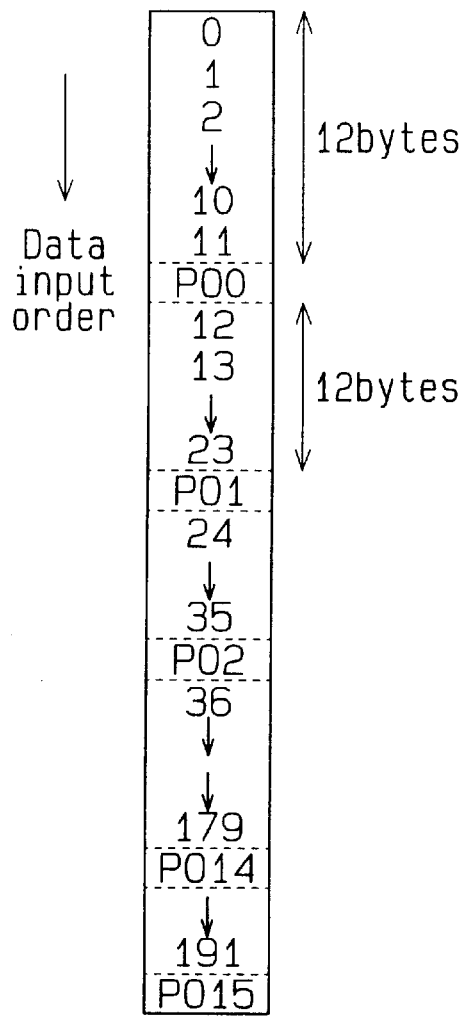
FIG. 6 is a schematic diagram showing a PO interleave with inserted PO-ECC sections.
Figure 7:
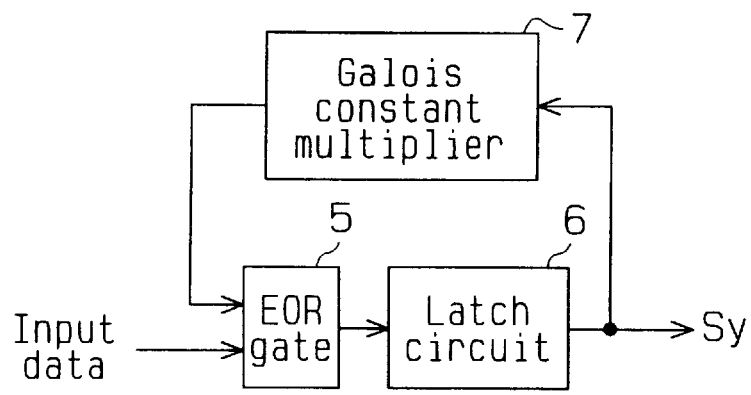
FIG. 7 is a schematic block diagram of a conventional syndrome operation unit.
Figure 8:
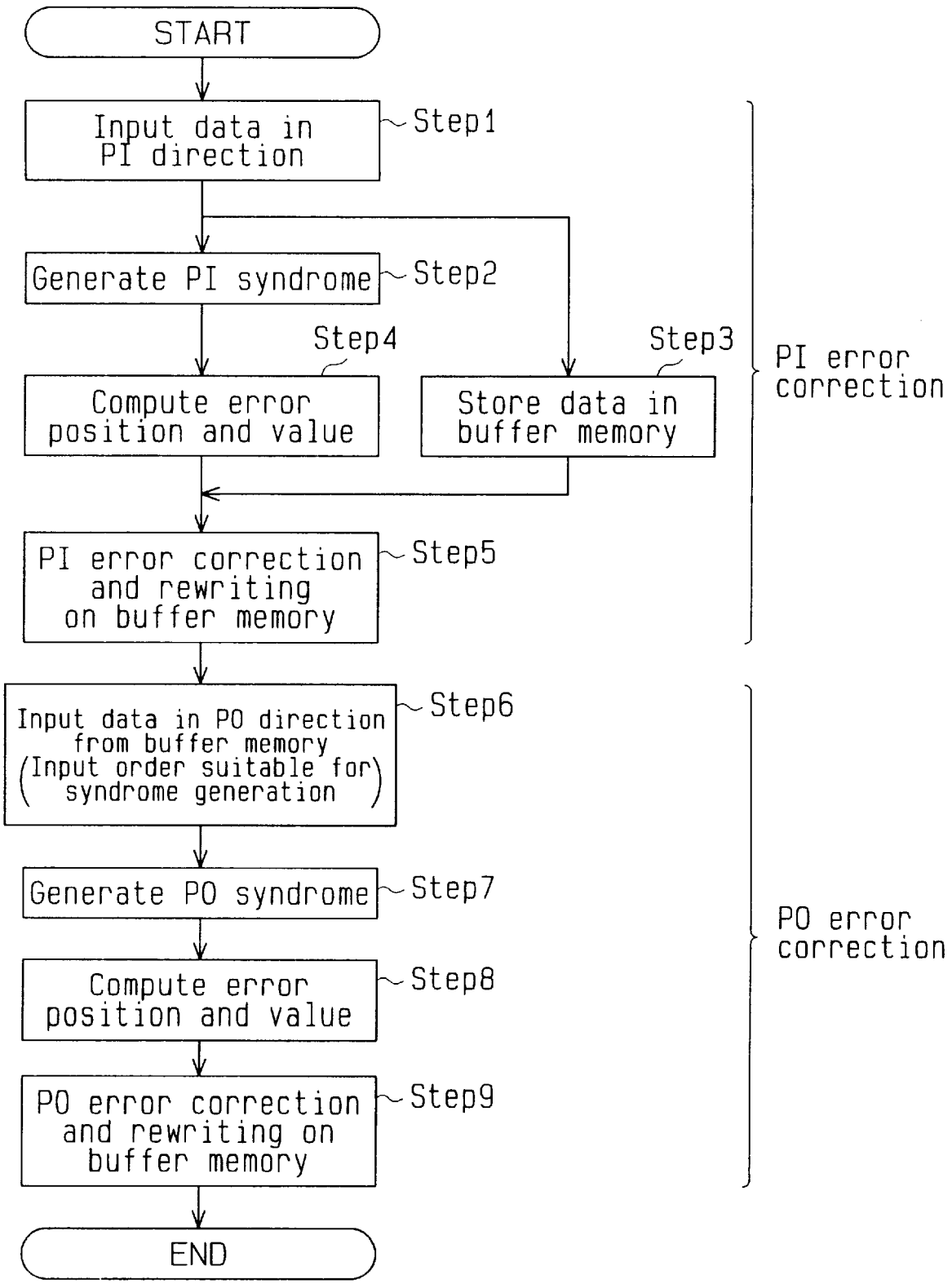
FIG. 8 is a flowchart illustrating a conventional error correcting operation.
Figure 10:
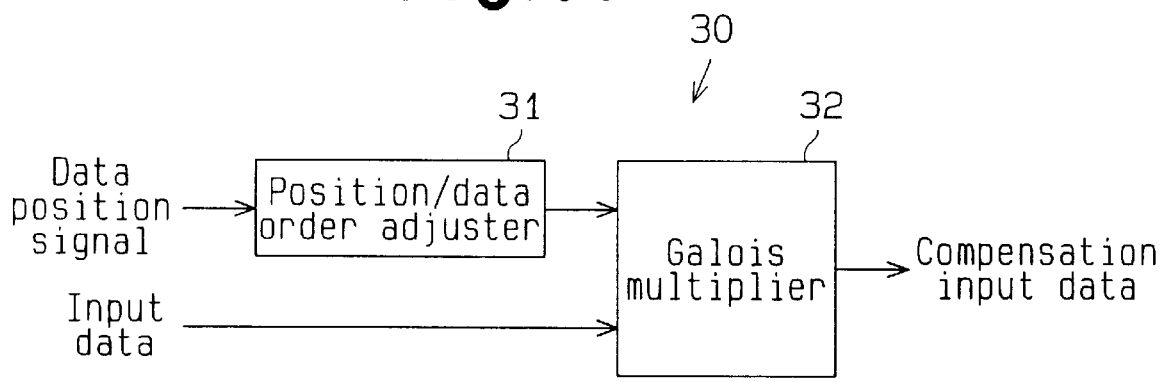
FIG. 10 is a schematic block diagram of a compensation input data generator in accordance with the present invention.

The control unit 25 is capable of generating error correcting syndromes in the PO direction without rearranging data even when PO interleaves are input in the order including PO-ECC data every 12 bytes, as shown in FIG. 6, from a data block 2. As shown in FIG. 10, the control unit 25 has a compensation input data generator 30 which comprises a data adjuster 31 and a Galois multiplier 32. The data adjuster 31 receives a data position signal from the optical disk drive 23. The data adjuster 31 computes a compensation Galois constant for compensating the input order of data based on data position signal, and sends the computed compensation Galois constant to the Galois multiplier 32. The Galois multiplier 32 receives the compensation Galois constant from the data adjuster 31 and data from the drive 23, and generates and outputs compensation input data a the compensated input order based on the computed compensation Galois constant.

Figure 1:
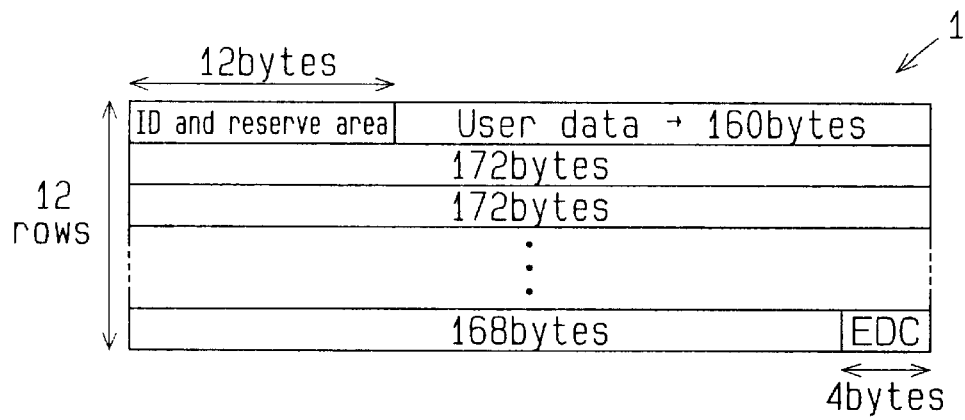
FIG. 1 is a schematic diagram showing the contents of a sector on a DVD-ROM.
Figure 2:
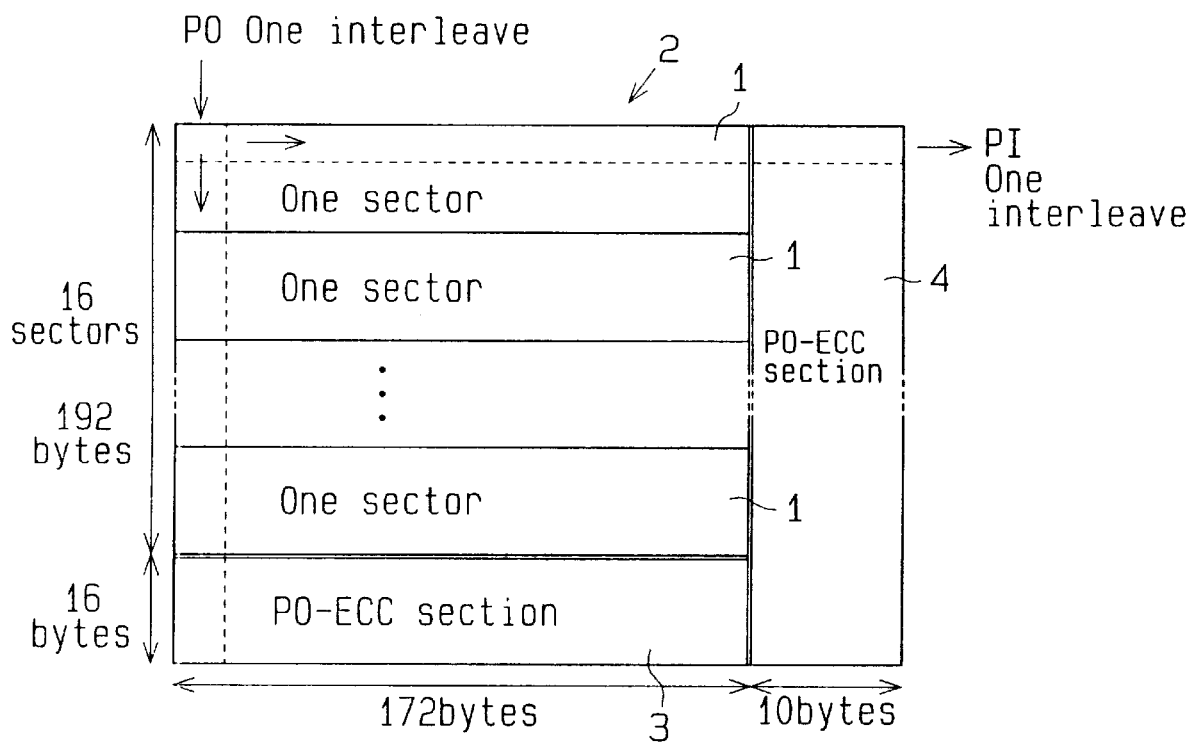
FIG. 2 is a schematic diagram of a data block of the sectors of FIG. 1.
Figure 3:
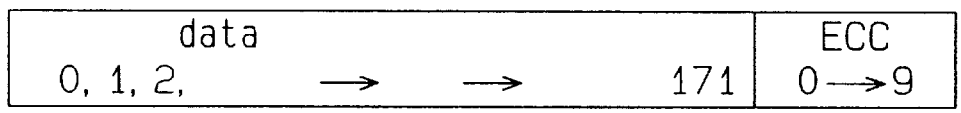
FIG. 3 is a schematic diagram of a PI interleave.
Figure 4:
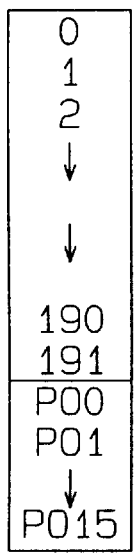
FIG. 4 is a schematic diagram of a PO interleave.
Figure 5:
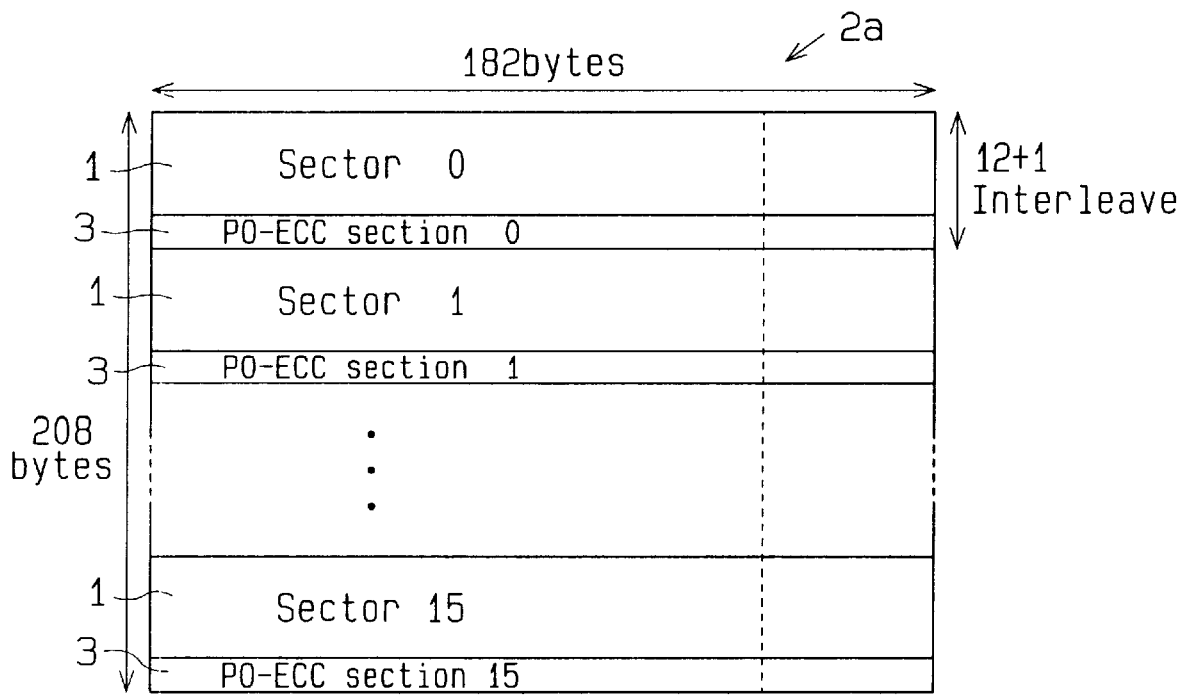
FIG. 5 is a schematic diagram depicting a data block with inserted PO-ECC sections.

The data adjuster 31 computes the order affixed with a difference between the position of the input data and the original position of the data. The original position is the position of the data at the time of the conventional syndrome generation (see FIGS. 3 and 4), i.e., the position of the data which has been rearranged for the generation of syndromes.

As discussed below, syndrome operation unit 50 (FIG. 11) computes correct syndromes even when receiving non-rearranged compensation input data, for the compensation input data already has an order weight which is included in the data corresponding to the input order for syndrome calculation.

Provided that the original data sequence for accurate computation of syndromes is given by $$Y = \{y_0, y_1, y_2, \ldots, y_k, \ldots, y_n\}, \quad (1)$$

a polynomial representing the order weight is expressed by $$Y(X) = y_0 \cdot X_n + y_1 \cdot X_{n-1} + y_2 \cdot X_{n-2} + \ldots + y_k \cdot X_{n-k} + \ldots + y_n \cdot X_0. \quad (2)$$

When the data is a Reed Solomon code, a syndrome Sy(x) is expressed by $$Sy(X) = \quad (3)$$
$$s_n \cdot X^n + s_{n-1} \cdot X^{n-1} + \ldots + s_k \cdot X^k + \ldots + s_{k-1} \cdot X^{k-1} + \ldots + s_0 \cdot X^0.$$

Letting Syi denote the i-th coefficient of the syndrome Sy and ai denote the Galois constant, the equation (3) is rewritten as $$Syi = Y(ai) \quad (4)$$
$$= y_0 \cdot ai^n + y_1 \cdot ai^{n-1} + \ldots + y_k \cdot ai^{n-k} + y_{k+1} \cdot ai^{n-k-1} + \ldots y_n \cdot ai^0.$$

When the k-th and (k+1)-th items in the input data are rearranged, $$Y = \{y_0, y_1, y_2, \ldots, y_{k+1}, y_k, \ldots, y_n\}, \quad (5)$$

and the input polynomial is expressed by the following equation (6).

$$Y(X) = \quad (6)$$
$$y_0 \cdot X_n + y_1 \cdot X_{n-1} + \ldots + y_{k+1} \cdot X_{n-k} + y_k \cdot X_{n-k-1} + \ldots + y_n \cdot X_0.$$

To accurately calculate syndromes, therefore, compensation for multiplying data $Y_k$ and $Y_k+1$ by a Galois constant $ai^m$ as given by $$Syi = y_0 \cdot ai^n + y_1 \cdot ai^{n-1} + \ldots + \quad (7)$$
$$(y_{k+1} \cdot ai^{i-1}) \cdot ai^{n-k} + (y_k \cdot ai^1) \cdot ai^{n-k-1} + \ldots y_n \cdot ai^0$$

where m is acquired from a relationship between the data position of the input data and the original data position required for syndrome computation. The compensation Galois constant makes the equation (7) equal to the equation (4).

The compensation Galois constant compensates the input data for the Galois constant computation which is performed in the conventional syndrome calculation, based on the difference between the number of operations on the data position of the input data and those on the original data position (the difference in order).

In the equation (7), the number of operations of ai as an operational difference for the k-th data is decreased by one while the number of operations of ai as an operational difference for the (k+1)-th data is increased by one.

When the relationship between the data position of the input data and the original position of the input data is as obvious as above, it is possible to compute a compensation Galois constant based on a previously set relative equation or determine it from a previously set data table.

The number of compensation computations for the input order of PO interleaves is determined according to a table as shown in FIG. 13. With regard to PO-ECC data which is the twelfth input data of a PO interleave, for example, the Galois constant ai is computed 195 times from the viewpoint of the input order, but the necessary number of operations is actually 15 times because the original input order is the 192nd. Based on the difference in the number of computations, therefore, the number of compensations is −180.

To compute the compensation Galois constant, the data adjuster 31 may be designed as shown in FIG. 12 or FIGS. 16 to 18. The data adjuster 31 shown in FIG. 12 has a correlation table 33 of the data positions of the input data and the original data positions of the input data. The data adjuster 31 extracts the original data position signal from the correlation table 33 based on the input data position signal. Then, a difference calculator 34 receives the data position signal of the input data and the original data position signal, and computes a compensation Galois constant based on both signals.

Figure 16:
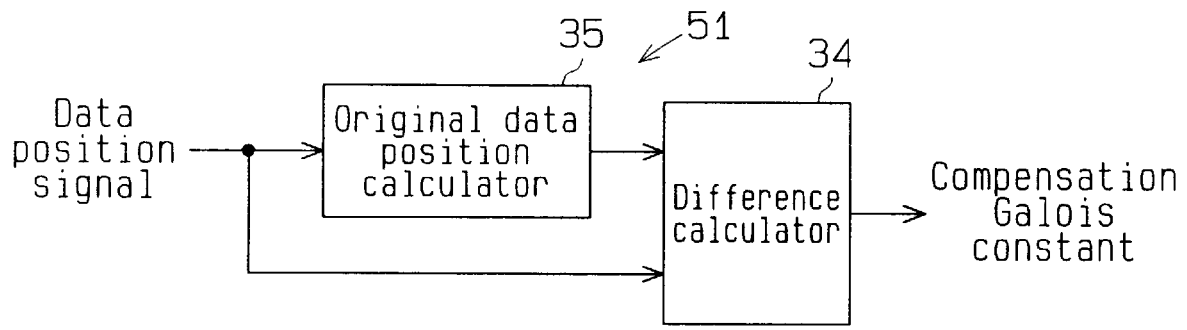
FIG. 16 is a schematic block diagram depicting a second embodiment of the data adjuster in accordance with the present invention.

The second embodiment of the data adjuster 51, shown in FIG. 16 has a calculator 35 for computing the original data position and a difference calculator 34 for computing a Galois constant. The calculator 35 computes the original data position signal based on the data position signal to be input. The difference calculator 34 receives both signals and computes a compensation Galois constant.

Figure 17:
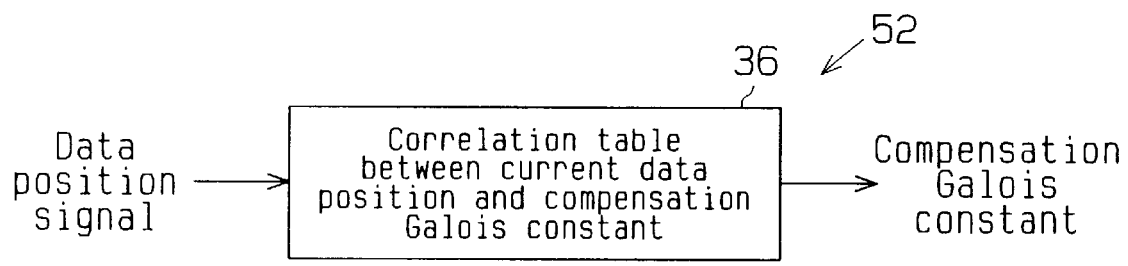
FIG. 17 is a schematic block diagram showing a third embodiment of the data adjuster in accordance with the present invention.

The third embodiment of the data adjuster 52 shown in FIG. 17 has a correlation table 36 of the data positions of the input data and compensation Galois constants corresponding to the data positions, and extracts an associated compensation Galois constant based on the input data position signal.

Figure 18:
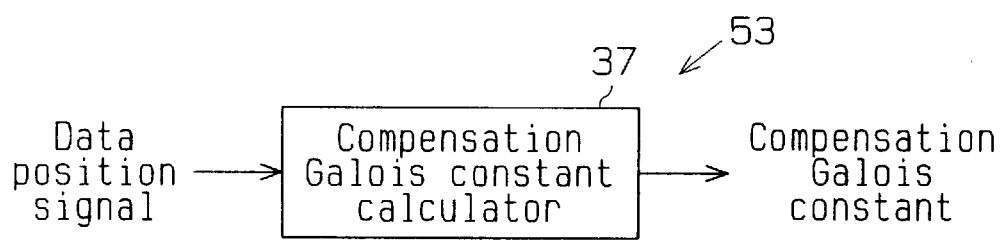
FIG. 18 is a schematic block diagram depicting a fourth embodiment of the data adjuster in accordance with the present invention.

The fourth embodiment of the data adjuster 53 shown in FIG. 18 has a calculator 37 for computing the data position of input data and a compensation Galois constants corresponding to that data position, and calculates an associated compensation Galois constant based on the input data position signal.

The correlation tables 33 and 36 and the calculators 35 and 57 may be properly combined as required. In this case, the correlation table or the calculator is properly selected based on the data position signal to compute a compensation Galois constant.

FIG. 14 shows a data table which holds compensation Galois constants with respect to the input order of PO interleaves. In the table, the individual constants are expressed by hexadecimal numbers.

Figure 11:
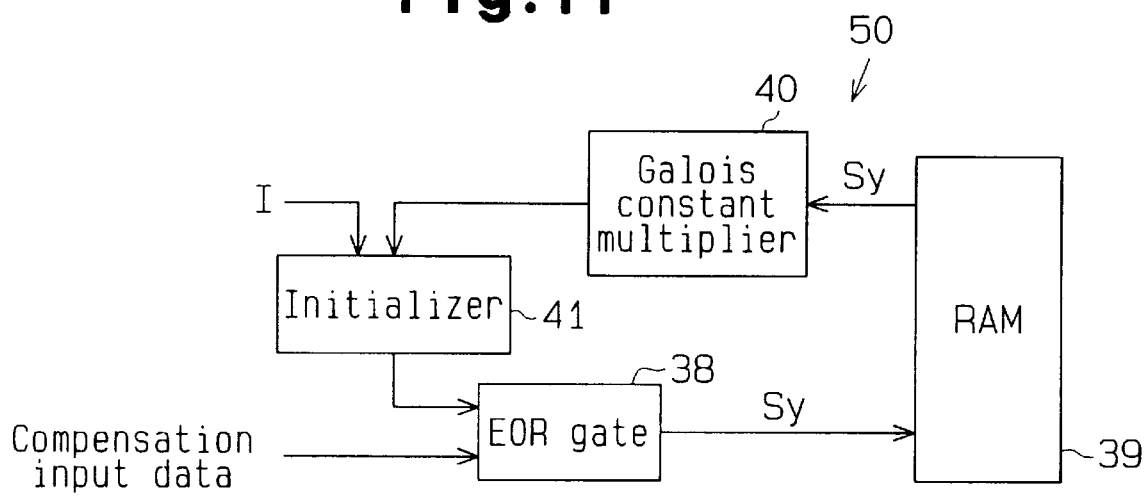
FIG. 11 is a schematic block diagram showing a syndrome operation unit in accordance with the present invention.
Figure 12:
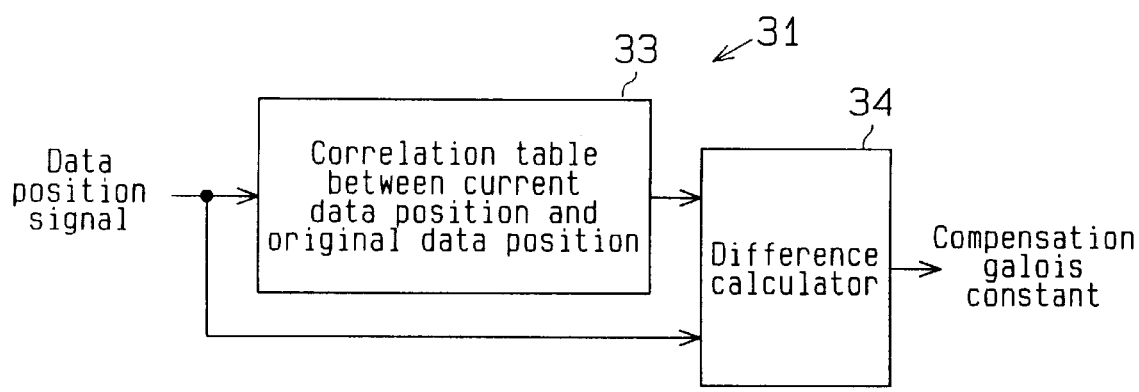
FIG. 12 is a schematic block diagram depicting a first embodiment of data adjuster in accordance with the present invention.

The syndrome operation unit 50 including a PI syndrome operation unit and a PO syndrome operation unit is equipped in the control unit 25 to generate syndromes in the PI direction and PO direction. As shown in FIG. 11, the syndrome operation unit 50 comprises an EOR gate 38, a RAM 39, a Galois constant multiplier 40 and an initializer 41.

The EOR gate 38 receives compensation input data from the Galois multiplier 32 and generates a syndrome Sy.

The RAM 39 stores the generated syndrome Sy. The Galois constant multiplier 40 reads the syndrome Sy from the RAM 39 and sends a signal, obtained by computing the syndrome Sy, to the EOR gate 38 via the initializer 41. The initializer 41 receives the signal from the Galois constant multiplier 40 and an initialization signal "I", and initializes the syndrome from the Galois constant multiplier 40 based on the initialization signal I which is input, for example, when computation of the PO syndrome starts. When no initialization signal I is input, the initializer 41 sends the output signal of the Galois constant multiplier 40 directly to the EOR gate 38.

The syndrome operation unit 50 can compute the syndrome of a PO interleave based on the data input sequentially in the PI direction. The syndrome acquired by the EOR gate 38 is temporarily stored in the RAM 39. When the EOR gate 38 receives compensation input data next, which belongs to the same PO interleave, the Galois constant multiplier 40 reads out the syndrome of the PO interleave from the RAM 39 and performs an operation thereon. The EOR gate 38 receives the computation result from the Galois constant multiplier 40 and generates a syndrome. The RAM 39 stores that syndrome. By repeating such an operation, the syndromes of the individual PO interleaves are generated based on the input compensation input data in the PI direction.

Figure 15:
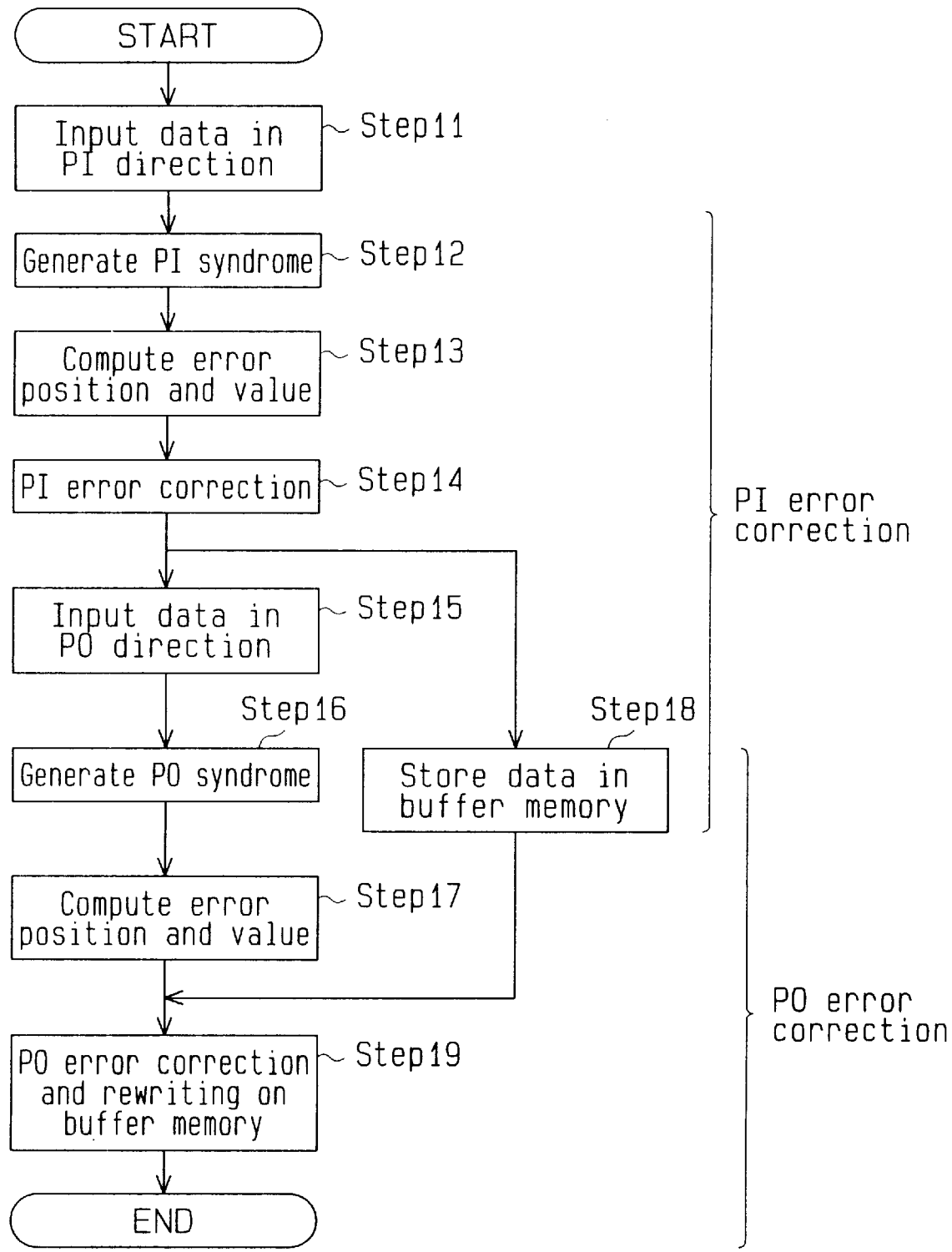
FIG. 15 is a flowchart illustrating an error correcting operation.

An error correcting operation under the control of the above-described control unit 25 will now be discussed with reference to FIG. 15.

The control unit 25 receives data in the PI direction from each sector 1 of the data block 2a, byte by byte (step 11), and sequentially generates PI syndromes for each single PI interleave (step 12).

When generating an error correcting syndrome of one interleave in the PI direction by means of the PI syndrome operation unit, the control unit 25 computes the position of error data in the interleave and a correction value for the error data (step 13), and performs an operation to rewrite the error data for one interleave stored in the control unit 25 (step 14). The control unit 25 repeats the above-described operation for every PI interleave and sequentially stores the corrected PI interleaves in the buffer memory 27 (step 18). The error correction in the PI direction consists of steps 1 to 14 and 18.

The control unit 25 generates compensation input data from each corrected PI interleave through the operations of the data adjuster 31 and the Galois multiplier 32. The control unit 25 sends the compensation input data to the PO syndrome operation unit (step 15), and generates a PO syndrome in the PO syndrome operation unit (step 16).

At this time, the control unit 25 sequentially generates syndromes of the individual PO interleaves based on the byte-by-byte inputs of the PO interleaves. When 1-byte data in the PI direction is input, for example, a PI syndrome for the PI interleave to which that input data belongs is generated. At the same time, one PO syndrome for the PO interleave to which the input data belongs is generated. One PI syndrome and one PO syndrome are generated in order in the mentioned manner for the input of one data in the PI direction.

When the syndrome of the individual PI interleaves are generated, the control unit 25 computes the position of error data and a correction value for the data for each interleave (step 17), and performs an operation of rewriting the error data on the buffer memory 27 (step 18).

The control unit 25 repeats such an operation for every PO interleave. The error correction in the PO direction steps 15 to 19.

In the error correction of the PO interleaves described above, the following effects can be obtained.

PI syndromes are generated without temporarily storing input data, read in the PI direction, in the buffer memory 27. After errors in data of PI interleaves are corrected, the individual PI interleaves are stored in the buffer memory 27. It is thus unnecessary to read data from the buffer memory 27 to correct an error in a PI interleave. This results in a reduced number of accesses to the buffer memory 27 and a shortened time for the generation of syndromes.

Since the syndrome of PO interleaves are generated on the basis of the input of the error-corrected PI interleaves in the PI direction, input data of one data block read in the PI direction need not be temporarily stored in the buffer memory. Therefore, the number of accesses to the buffer memory and the time for the generation of syndromes are further reduced.

Second Embodiment

Figure 19:
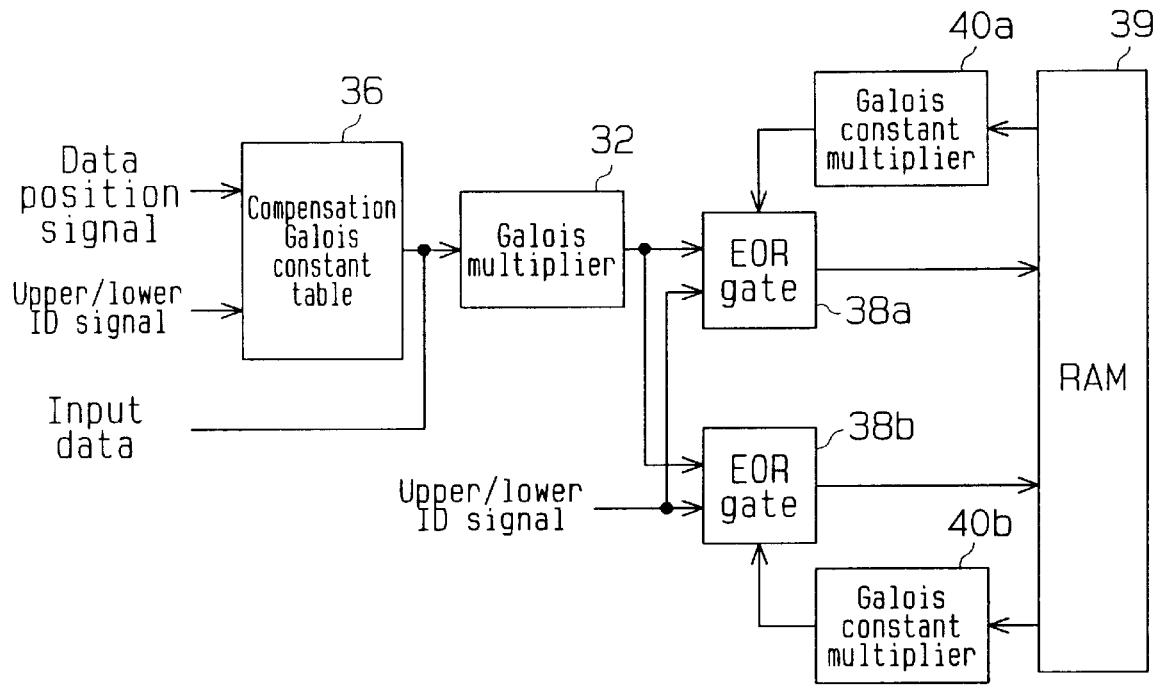
FIG. 19 is a block diagram showing a part of an error correcting apparatus according to a second embodiment of the present invention.

A second embodiment of the present invention will now be described referring to FIG. 19. To perform 16-byte PO syndrome computation on 1-byte input data, the compensation input data generator and syndrome operation unit according to the second embodiment separately performs two operations on the 1-byte input data, one for the upper eight bytes and the other for the lower eight bytes according to the order.

To execute a syndrome computation for the upper eight bytes on the higher order side, the data generator extracts a compensation Galois constant for the upper eight bytes from the compensation Galois constant correlation table 36 based on the data position signal of input data and the upper/lower identification (ID) signal, and computes corrected input data in the Galois multiplier 32. The upper syndrome operation unit computes a syndrome for the upper eight bytes based on data from the Galois multiplier 32 and the syndromes stored the RAM 39.

Next, the data generator likewise extracts a compensation Galois constant for the lower eight bytes from the table 36 and computes corrected input data in the Galois multiplier 32. The lower syndrome operation unit computes a syndrome for the lower eight bytes based on data from the Galois multiplier 32 and the syndromes stored in the RAM 39.

Computing syndromes eight bytes each in this manner contributes to reducing the circuit scale of the syndrome operation unit.

The operational division by the operational order may be carried out every four bytes, every two bytes or every one byte, instead of the aforementioned units of eight bytes.

Third Embodiment

Figure 20:
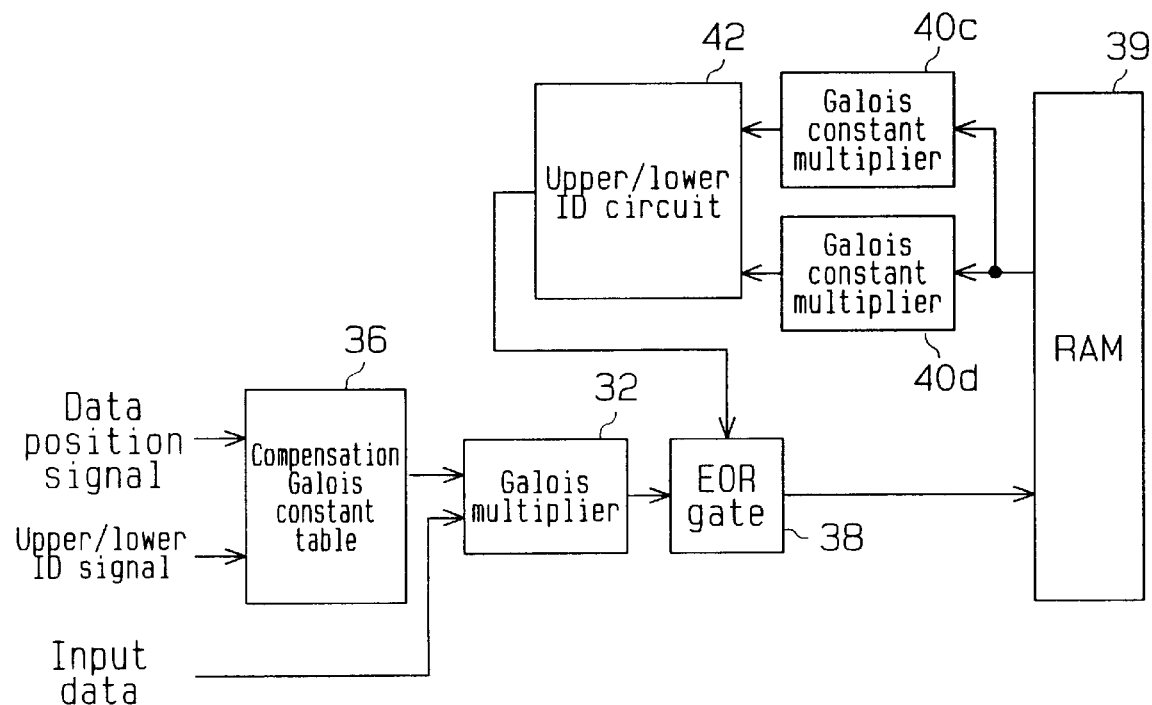
FIG. 20 is a block diagram showing a part of an error correcting apparatus according to a third embodiment of the present invention.

Data error correcting apparatus according to a third embodiment, like that of the second embodiment, performs a syndrome operation separately for upper and lower eight bytes, but by using a single syndrome operation unit, as shown in FIG. 20.

The operation of an identifying circuit 42 based on an upper/lower ID signal switches the generation of syndromes between the upper eight bytes and the lower eight bytes. This allows Galois constant multipliers 40c and 40d to operate in the same manner as the Galois constant multiplier in the second embodiment. The structure eliminates one EOR gate and further reduces the circuit scale.

Therefore, the present examples and embodiment are to be considered as illustrative and not restrictive and the invention is not to be limited to the details given herein, but may be modified within the scope of the appended claims.

What is claimed is:

1. A method of correcting an error in two-dimensional block data having row error correcting codes for individual rows of data and column error correcting codes for individual columns of data, one column error correcting code being assigned to a predetermined number of the column data, the column data and the individual column error correcting codes being alternately arranged, the row data and the column error correcting codes having a first weight according to a first order such that the individual column error correcting codes are arranged after all of the column data groups, the method comprising the steps of:

correcting errors column by column using the row data and the row error correcting codes;

receiving the column data;

compensating the first weight for generating a second weight according to the received column data when the received column data is in a second order different from the first order; and correcting errors row by row based on the generated second weight, using the column data and the column error correcting codes.

2. The method according to claim 1, wherein the row error correcting step includes a step of computing syndromes for the row data, and wherein the column error correcting step includes a step of computing syndromes for the column data.

3. The method according to claim 2, wherein the compensating step includes the steps of:

setting the second weight as an operational order for the received column data; and compensating the operational order for the received column data when the received column data is in the second order.

4. The method according to claim 3, wherein the compensating step further includes the steps of:

extracting a difference between the first order and the second order of the received column data from a compensation table; and computing the operational order based on the extracted difference.

5. The method according to claim 3, wherein the compensating step further includes a step of compensating the operational order based on a difference between the first order and the second order of the received column data.

6. The method according to claim 3, wherein the compensating step further includes the steps of:

extracting a difference between the first order and the second order of the column error correcting codes from a compensation table; and computing the operational order based on the extracted difference.

7. An error correcting apparatus comprising: a control unit for correcting an error in two-dimensional block data having row error correcting codes for individual rows of data and column error correcting codes for individual column of data, one column error correcting code being assigned to one column data group, the column data group and the individual column error correcting codes being alternately arranged, the column data and the column error correcting codes having a first weight according to a first order such that the individual column error correcting codes are arranged after all column data groups; and a compensating device for compensating the first weight for generating a second weight according to the received column data when the received column data is in a second order different from the first order, wherein the control unit corrects errors column by column using the row data and the row error correcting codes, and corrects errors row by row based on the generated second weight using the column data and the column error correcting codes.

8. The apparatus according to claim 7, wherein the compensating device sets the second weight as an operational order for the received column data, and compensates the operational order for the received column data when the received column data is in the second order.

9. The apparatus according to claim 8, further comprising:
a row syndrome operation unit in communication with the control unit for computing syndromes for row data; and
a column syndrome operation unit in communication with the control unit for computing syndromes for column data,
wherein the control unit corrects errors in the row data and the column data based on the computed syndromes.

10. The apparatus according to claim 8, wherein the control unit sequentially reads the row data and the row error correcting codes to correct the row data, the apparatus further comprising a column syndrome operation unit in communication with the control unit for generating syndromes for column data belonging to either read row data or row error data to correct column data, without rearranging the received column data in the first order.

11. The apparatus according to claim 10, further comprising a compensating device for compensating a weight for the column data based on a difference between the first order and the second order; and
wherein the column syndrome operation unit generates syndromes for column data based on the compensated weight, and
wherein the control unit corrects errors in the column data based on the generated syndromes.

12. The apparatus according to claim 11, wherein the column syndrome operation unit includes a storage device for storing a result of an operation performed every time each column data is input, and generates syndromes by sequentially performing operations on each column data and the stored operation result.

13. The apparatus according to claim 12, wherein the control unit includes a buffer memory and the control unit rearranges corrected row and column data in the first order and then stores the rearranged data in the buffer memory.

14. The apparatus according to claim 12, wherein the compensating device compensates operational orders of the column data and the column error correcting codes for generating syndromes of column data corresponding to the first order.

15. The apparatus according to claim 14, wherein the compensating device compensates the operational orders based on a difference between the first order and second order of the column data and the column error correcting codes.

16. The apparatus according to claim 14, further comprising:
a compensation table for extracting a difference between the first order and second order of the column data and the column error correcting codes; and
a calculator for calculating an operational order based on a value extracted from the compensation table.

* * * * *